US011658055B2

(12) United States Patent
Nad et al.

(10) Patent No.: US 11,658,055 B2
(45) Date of Patent: May 23, 2023

(54) CUSTOMIZABLE RELEASE LAYERS TO ENABLE LOW WARPAGE ARCHITECTURES FOR ADVANCED PACKAGING APPLICATIONS

(71) Applicant: Intel Corporation, Santa Clara, CA (US)

(72) Inventors: Suddhasattwa Nad, Chandler, AZ (US); Rahul Manepalli, Chandler, AZ (US)

(73) Assignee: Intel Corporation

( * ) Notice: Subject to any disclaimer, the term of this patent is extended or adjusted under 35 U.S.C. 154(b) by 909 days.

(21) Appl. No.: 16/363,426

(22) Filed: Mar. 25, 2019

(65) Prior Publication Data

US 2020/0312698 A1    Oct. 1, 2020

(51) Int. Cl.
*H01L 21/683* (2006.01)
*H01L 25/065* (2023.01)
*H01L 23/538* (2006.01)

(52) U.S. Cl.
CPC ...... *H01L 21/6836* (2013.01); *H01L 23/5383* (2013.01); *H01L 25/0655* (2013.01)

(58) Field of Classification Search
CPC ............ H01L 21/6836; H01L 23/5383; H01L 25/0655; H01L 23/49894; H01L 21/568; H01L 23/49816; H01L 23/5389; H01L 2224/18; H01L 21/6835; H01L 23/3107; H01L 2221/68318; H01L 2221/68381
See application file for complete search history.

(56) References Cited

U.S. PATENT DOCUMENTS

2008/0241418 A1*  10/2008  Allen .................... B82Y 40/00
                                              427/559
2015/0048515 A1*   2/2015  Zhang ............... H01L 21/76802
                                              257/774

* cited by examiner

*Primary Examiner* — Syed I Gheyas
(74) *Attorney, Agent, or Firm* — Schwabe, Williamson & Wyatt P.C.

(57) ABSTRACT

Embodiments disclosed herein include electronic packages and methods of forming such packages. In an embodiment, the electronic package comprises a package substrate having a first surface and a second surface opposite from the first surface, and a monolayer having a plurality of first molecules over the first surface of the package substrate. In an embodiment, the first molecules each comprise a first functional group attached to the first surface, and a first release moiety attached to the first functional group.

18 Claims, 11 Drawing Sheets

CUSTOMIZABLE RELEASE LAYERS TO ENABLE LOW WARPAGE ARCHITECTURES FOR ADVANCED PACKAGING APPLICATIONS

TECHNICAL FIELD

Embodiments of the present disclosure relate to electronic packaging, and more particularly, to release layers that are modifiable by electromagnetic radiation at selected frequencies to provide a non-mechanical separation of the electronic package from a carrier.

BACKGROUND

Substrates for next generation chip-to-chip interconnect technologies require significantly higher speed and higher density input/out (I/O) routing for enabling multi-die packing architectures. Such architectures, (e.g., high density packaging (HDP), and embedded multi-die interconnect bridge (EMIB)) use a combination of decreasing fine line spacing (FLS) and multi-chip assemblies unified on a package. Embedded dies within the substrate package and/or assembled dies on the substrate package enable the creation of multi-chip electronic packages delivering system-on-a-chip (SOC) type architecture to multi-process node chiplet architectures.

These architectures require the use of multiple embedded or assembled silicon IC chips on the same package substrate, which drives the need for low warpage solutions and tight bump-top variation (BTV) control. Glass based low warpage rigid flat carriers are currently being used as the base for the creation of these complex packages. However, removal of the constructed package from these carriers is dependent on the efficacy of the release layer. Typically, the release layer is a chemically bonded adhesion layer and requires mechanical force to separate. This causes a large mechanical force to be applied to the package itself. Accordingly, the package is susceptible to deformation, warpage, and/or other defects. Such processes, therefore, compromise the integrity of any embedded silicon chips and redistribution layer (RDL) interconnects and reduces yield.

EMBODIMENTS OF THE PRESENT DISCLOSURE

Figure 1A:
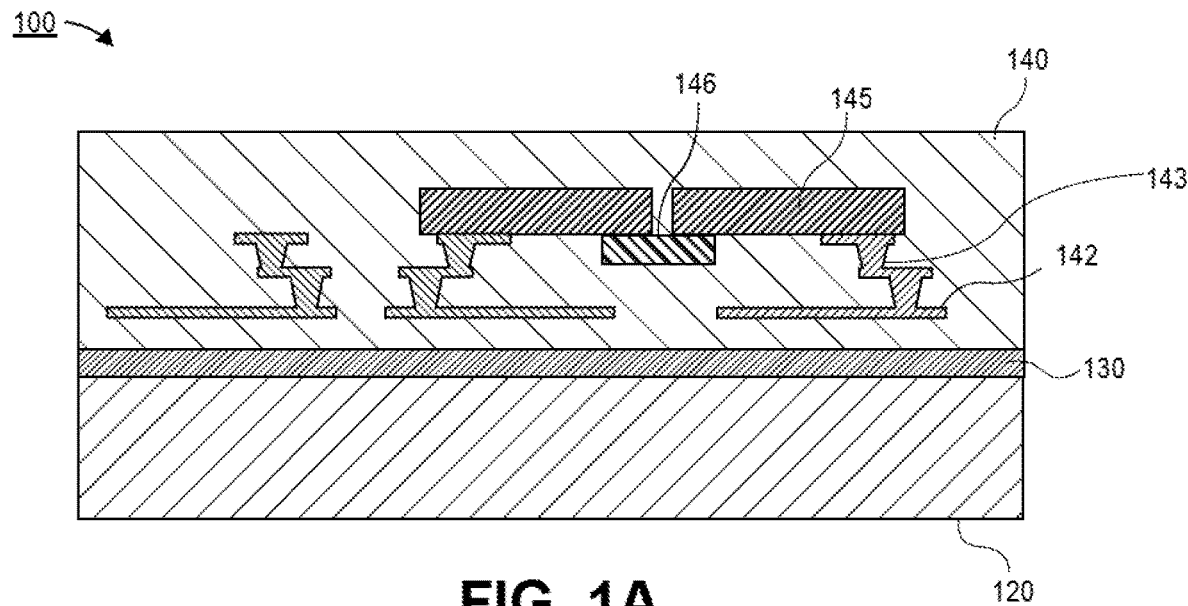
FIG. 1A is a cross-sectional illustration of an electronic package adhered to a carrier with a monolayer, in accordance with an embodiment.

Described herein are electronic packages with release layers that are modifiable by electromagnetic radiation at selected frequencies to provide a non-mechanical separation of the electronic package from a carrier and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, advanced multi-chip package architectures necessitate low warpage assembly in order to provide adequate yields. Current approaches of assembly that include adhesively bonding the package substrate to a glass carrier require mechanical separation that damages the system. Accordingly, embodiments disclosed herein include a release layer that is severed with a chemical reaction instead of mechanical separation. Particularly, embodiments include a release layer that is a monolayer comprising molecules with one or more release moieties. The release moieties are moieties that preferentially absorb electromagnetic radiation at a selected frequency band (e.g., microwave or ultraviolet frequency bands) and chemically react to sever the monolayer. Furthermore, the functional groups may be tuned to provide excellent adhesion of the dielectric layer to the carrier. Accordingly, the package substrate may be adequately secured during processing and subsequently released from the carrier without applying excessive force.

Embodiments disclosed herein provide extensive benefits and allow for customization of parameters in order to provide desired results. For example, the release characteristics may be tuned to desired microwave or ultraviolet (e.g., laser) frequencies and powers by choosing a desired release moiety or by using more than one release moiety in each molecule of the monolayer. Furthermore, the functional groups that adhere to the dielectric layer may be changed to accommodate different polymers used for the dielectric layer. Additionally, the toolsets and materials needed to implement severable monolayers in accordance with embodiments disclosed herein are already present in many facilities. In an embodiment, the residual portion of the monolayer remaining on the dielectric layer after release from the carrier may also be easily removed to provide access to the dielectric layer in order to allow for typical backside processing.

Embodiments discussed herein variously provide techniques and mechanisms for improved release of a dielectric layer from a carrier by using a monolayer with molecules comprising one or more release moieties. The term "monolayer" refers herein to a film of a given molecule, wherein the film is only one molecule thick on a surface structure. "Self-assembled monolayer" (or "SAM") refers herein to a monolayer formed by a reaction at a surface, wherein such reaction results in monolayer molecules lining up in a uniform manner. More particularly, a molecules may "self-assemble" by each forming a respective highly selective bond at the surface and orient itself perpendicular to the face of the surface. Through such a reaction, a uniform monolayer film may be formed. In the context of any given monolayer, a molecule (or molecules) of the monolayer refers herein to those molecules which are each of the majority molecule type in the monolayer.

In various embodiments, at least some portion of a surface ("surface portion") is bonded to at least some portion of another surface via a monolayer, molecules of which may be a product of a chemical reaction by molecules of an earlier-formed monolayer. Such a reaction may extend molecules of the earlier-formed monolayer (e.g., by joining respective molecules of two earlier-formed monolayers which were bonded each to a different respective surface portion).

Bonding of surface portions according to one embodiment may include forming a first monolayer of a molecule M1 on a first surface portion. The M1 molecule may have a structure R1-X1-L1-X2-R2, wherein the functional groups R1, R2 are at opposite ends of organic moieties X1, L1, and X2. In an embodiment, the organic moieties X1 and X2 may be a chain of carbon atoms, and moiety L1 may be a release moiety. "Release moiety" refers herein to a moiety that selectively absorbs electromagnetic radiation of a desired frequency band in order to sever the monolayer at the release moiety. For example, release moieties may be moieties that absorb microwave or ultraviolet radiation and, as a result, chemically react in order to sever the monolayer. For example, the release moiety L1 may comprise a metallic alkoxide, a metallic oxide nanoparticle, a flavonoid, a flavonoid derivative (e.g., an isoflavanoid, a neoflavanoid, or an aurone), a sinapinic acid, a sinapinic acid derivative, or the like.

Functional group R1 (referred to herein simply as "R1") may be substantially non-reactive with functional group R2 (referred to herein simply as "R2"). Such non-reactivity between R1 and R2 may mitigate self-polymerization of a M1 molecule, thus facilitating formation of a monolayer of M1 molecules. As used herein in the context of two given functional groups, "substantially non-reactive" means that, at least at standard temperature and pressure, one functional group will not bond with or otherwise chemically react with the other functional group. In some embodiments, R2 is also substantially non-reactive with the surface portion to which R1 bonds. In one example embodiment, R2 includes any of a variety of acids, acid anhydrides, aliphatic alcohols, aromatic alcohols, or unsaturated hydrocarbons. In an embodiment, where the first surface portion is a glass carrier, R1 may comprise siloxanes, siloxane derivatives, silanes, acrylates, or any other functional group that is substantially reactive with the first surface portion of the carrier.

Although some embodiments are not limited in this regards, M1 molecules of the first monolayer may then be modified into M1' molecules (e.g., prior to bonding of the first surface portion with a second surface portion). For example, M1 molecules may be modified by a chemical process (e.g., including acylation and/or esterification) which results in another functional group R3 in place of the previous R2 functional group.

Another molecule M2 may subsequently be reacted with M1 molecules of the first monolayer (or in some embodiments, with M1' molecules of a modified first monolayer) to form a second monolayer. The M2 molecules may each have a structure R4-X3-L2-X4-R5, wherein functional groups R4, R5 are at opposite ends of organic moieties X3, L2, and X4. In an embodiment, the organic moieties X3 and X4 may be a chain of carbon atoms, and moiety L2 may be a release moiety. For example, the release moiety L2 may comprise a metallic alkoxide, a metallic oxide nanoparticle, a flavonoid, a flavonoid derivative (e.g., an isoflavanoid, a neoflavanoid, or an aurone), a sinapinic acid, a sinapinic acid derivative, or the like.

In such an embodiment, R4 functional groups of the M2 molecules may react with R2 functional groups of the first monolayer (or in some embodiments, with M1' molecules of a modified first monolayer) to variously bond moieties X2, X3 together and to form a monolayer of M3 molecules. The M3 molecules may each have a structure R1-X1-L1-X2-R6-X3-L2-X4-R5, wherein the moiety R6—referred to herein as an "intermediate moiety"—is formed by reaction of R2 with R4 (or in some embodiments, by reaction of R3 with R4).

The M3 molecules may be subsequently bonded, via the R5 functional groups thereof, to a second surface portion (e.g., a dielectric layer surface), wherein the first surface portion and the second surface portion are bonded to each other by the second monolayer. In other embodiments, the M2 molecules are bonded to the second surface portion prior to being reacted with M1 molecules of the first monolayer (or in some embodiments, with M1' molecules of a modified first monolayer).

In such an embodiment, one of R1 or R5 may be suitable to adhere to (e.g., bond with) a glass surface and the other of R1 or R5 is suitable to adhere to a dielectric surface. For example, R1 may include, or be a derivative of, any of siloxanes, siloxane derivatives, silanes, acrylates, or any other functional group that is substantially reactive with the first surface portion of the carrier (e.g., glass). Alternatively, or in addition, R5 may include, or be a derivative of, any of a variety of amines, azoles, imides, or cyanoacrylate derivatives—e.g., wherein R5 enables a strong covalent bond with a dielectric polymer. Bonding or other adhering of a functional group with a surface portion may be via chemisorption or physisorption, in some embodiments.

The functional group R3—that, in some embodiments, is produced from a reaction by R2—may include a group resulting from acylation or esterification of an acid anhydride, a thioanhydride, or an amide. Functional group R4 may be reactive with R2 and/or with any functional group R3 that might be produced from R2 prior to reaction with a M2 molecule. For example, R4 may include, or be a derivative of, any of a variety of amines, thiols, disulfides, acid anhydrides, or alcohols. In some embodiments, R4 is substantially non-reactive with R5.

The organic moieties X1, X2, X3, and/or X4 may comprise an aliphatic chain of carbon atoms (e.g., wherein the chain is saturated). In some embodiments, X1, X2, X3, and/or X4 include a derivative of an ethyl group, a propyl group, a butyl group or the like. Alternatively, organic moieties X1, X2, X3, and/or X4 may include a long aliphatic chain of carbon atoms, the structure of which is resistive of chain folding.

Although some embodiments are not limited in this regard, a reaction to form the second monolayer from the first monolayer may include an addition reaction between M1 and M2. The term "addition reaction" refers herein to a reaction between two molecules which combine to form, as a single reaction product (the "adduct"), a larger molecule which includes all atoms of the two molecules—e.g., where the reaction does not further produce any other by-product. In using a reaction between two monolayers, some embodiments variously provide for very strong bonding that, for example, may be tailored to a particular combination of material layers which are to be joined together.

After the dielectric layer is securely bonded to the carrier via the M3 molecule, an electronic package may be fabricated over the dielectric layer. An example, of such an electronic package 100 is shown in FIG. 1A.

While the M3 molecule above is described as the adduct of various molecules (e.g., M1 and M2) that include one or more release moieties, it is to be appreciated that embodiments are not limited to such configurations. Particularly, any bi-functional molecule may be used in order to secure a carrier to the dielectric layer. In some embodiments, a release moiety itself may provide sufficient bifunctionality to secure the layers together. In such embodiments, the molecule M3 may only comprise a release moiety. In other embodiments, the molecule M3 may comprise a chain of one or more moieties connected to the release moiety. For example, the chain of one or more moieties may be between the release moiety and the carrier and the release moiety is connected to the dielectric layer, or the chain of one or more moieties may be between the release moiety and the dielectric layer and the release moiety is connected to the carrier.

Referring now to FIG. 1A, a cross-sectional illustration of an electronic package 100 is shown, in accordance with an embodiment. In an embodiment, the electronic package 100 may comprise a carrier 120 and a package substrate 140. The carrier 120 may be securely bonded to the package substrate 140 via a monolayer 130 (e.g. comprising molecules, such as M3 molecules described above). In an embodiment, the carrier 120 may be a dimensionally stable substrate, such as glass. The package substrate 140 may comprise one or more layers of dielectric material, such as polyimide (PI), polytetrafluoroethylene (PTFE), Build-up Film (in general, any of various silica particle filled epoxy materials), a liquid crystal polymer (LCP), and polyetheretherketone (PEEK). In some embodiments, the package substrate 140 may comprise laminated material such as FR4, FR5, bismaleimide triazine (BT) resin, etc. The package substrate 140 may also comprise a woven or reinforced core (not shown) or—alternatively—may be coreless, in various embodiments.

In an embodiment, the package substrate 140 may comprise conductive traces 142 and vias 143. The conductive traces 142 and vias 143 may provide electrical routing for one or more dies 145 embedded in the package substrate 140. In some embodiments, dies 145 may be coupled together by a bridge 146. For example, the bridge 146 may be a silicon bridge (e.g., an embedded multi-die interconnect bridge (EMIB)) that provides fine line spacing (FLS) interconnects between dies 145. In an embodiment, the bridge 146 may be positioned below the dies 145, as is typical in EMIB architectures. However, it is to be appreciated that the bridge 146 may also be over the dies 145 in embodiments that utilize other packaging architectures. While an EMIB architecture is illustrated in FIG. 1A, it is to be appreciated that any packaging architecture that requires low warpage may benefit from embodiments disclosed herein. For example, architectures such as, high density packaging (HDP), and other architectures that use a combination of decreasing FLS and multi-chip assemblies unified on a package may be implemented in the package substrate 140. Embedded dies within the package substrate 140 and/or assembled dies on the package substrate 140 enable the creation of multi-chip electronic packages delivering system-on-a-chip (SOC) type architecture to multi-process node chiplet architectures.

After the electronic package 100 is assembled, the package substrate 140 is removed from the carrier 120. In contrast to the mechanical separation described above, embodiments disclosed herein include a non-mechanical separation that is enabled by the release moieties in the monolayer 130.

Figure 1B:
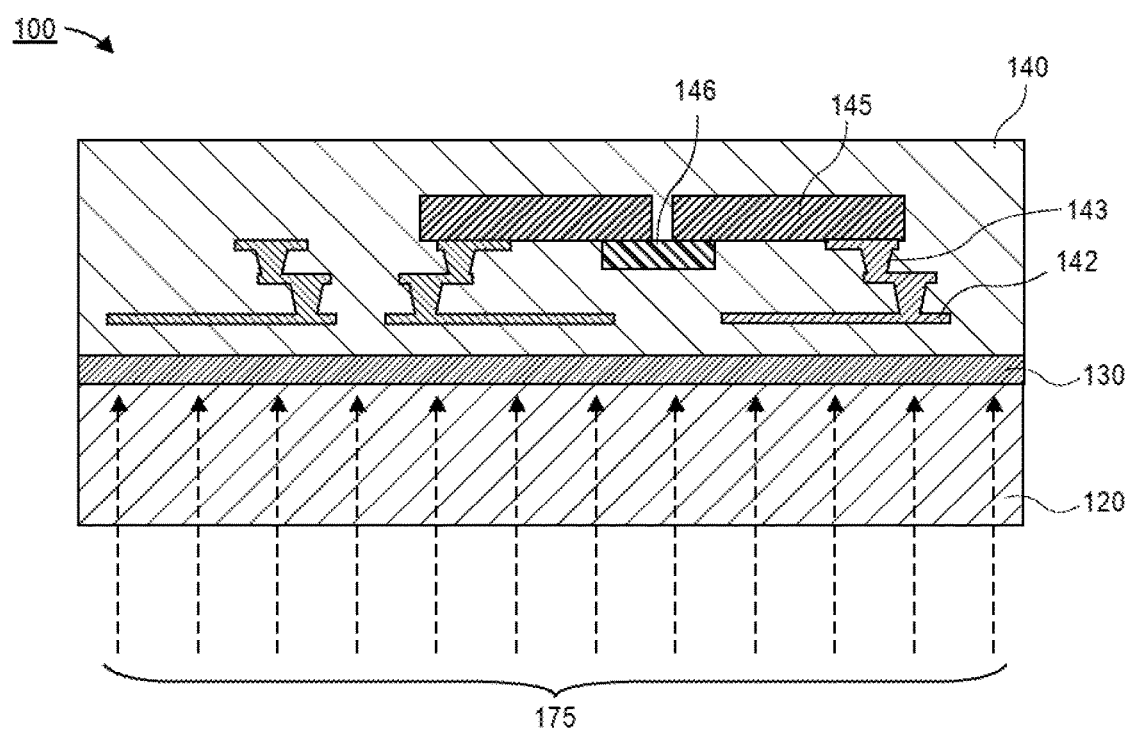
FIG. 1B is a cross-sectional illustration of the electronic package as the monolayer is exposed to electromagnetic radiation at a frequency band that is selectively absorbed by a moiety in the monolayer, in accordance with an embodiment.

Referring now to FIG. 1B, a cross-sectional illustration of the electronic package 100 as the monolayer 130 is exposed to electromagnetic radiation 175 that passes through the carrier 120 is shown, in accordance with an embodiment. In an embodiment, the electromagnetic radiation 175 may be at a frequency band that is absorbed by release moieties of the monolayer 130. For example, the frequency band may be a microwave frequency band, an ultraviolet frequency band (e.g., a near ultraviolet radiation frequency band, a middle ultraviolet radiation frequency band, a far ultraviolet radiation frequency band, an extreme ultraviolet radiation frequency band), or an X-ray frequency band. Exposure of the monolayer 130 to the electromagnetic radiation 175 initiates a chemical reaction at the release moieties that results in a severing of the monolayer 130.

Figure 1C:
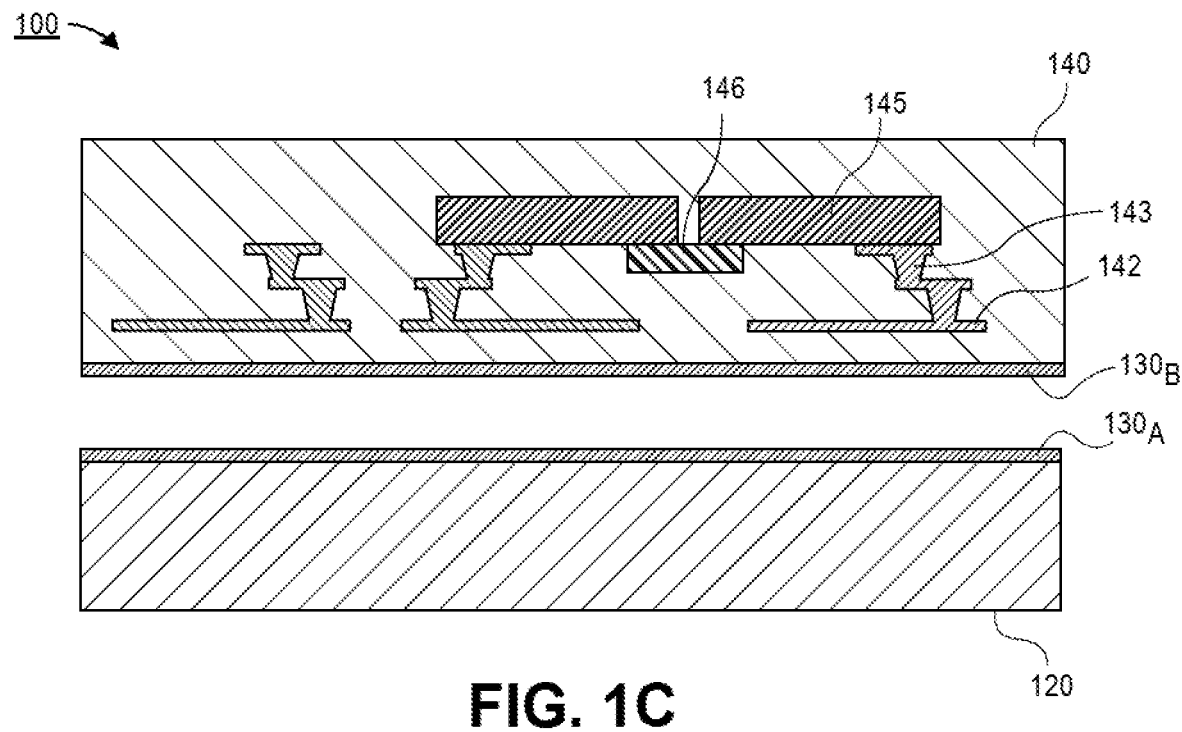
FIG. 1C is a cross-sectional illustration of the electronic package after the monolayer is severed and the electronic package is released from the carrier, in accordance with an embodiment.

Referring now to FIG. 1C, a cross-sectional illustration of the electronic package 100 after the monolayer 130 is severed and the package substrate 140 is removed from the carrier is shown, in accordance with an embodiment. In an embodiment, the severed monolayer 130 may include a first portion 130A that remains attached to the carrier 120 and a second portion $130_B$ that remains attached to the package substrate 140. After severing the monolayer 130, the package substrate 140 may be lifted up off of the carrier 120 without exerting excessive force on the package substrate 140. Accordingly, warpage or other damage to the package substrate 140 during the removal from the carrier 120 is reduced compared to mechanical separation processes that are needed when an adhesive is used, as described above.

Referring now to FIGS. 2A-2E, a series of cross-sectional illustrations of a process for attaching a dielectric layer to a carrier with a monolayer that includes one or more release moieties is shown, in accordance with an embodiment.

Figure 2A:
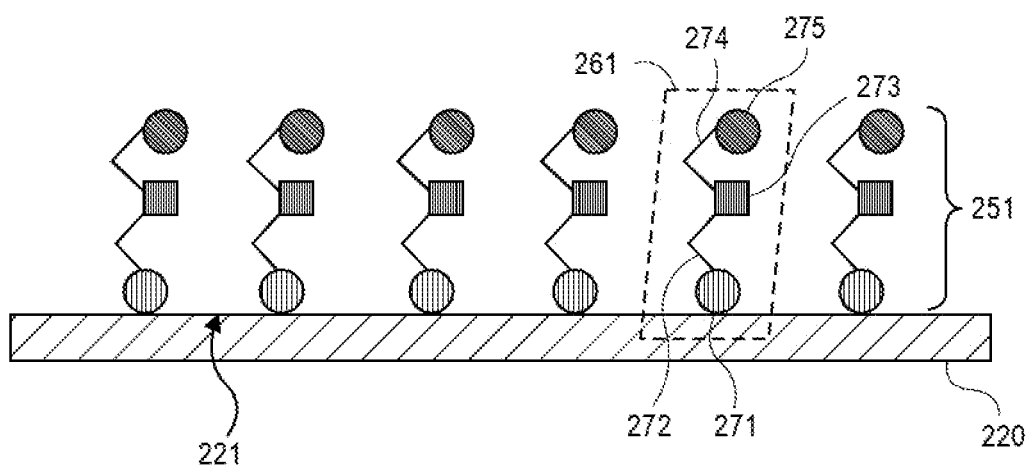
FIG. 2A is a cross-sectional illustration of a first monolayer comprising first molecules with a first release moiety that is disposed over a carrier, in accordance with an embodiment.

Referring now to FIG. 2A, a cross-sectional illustration of a carrier 220 with a first monolayer 251 comprising first molecules 261 is shown, in accordance with an embodiment. In an embodiment, the first monolayer 251 may be a self-assembled monolayer. That is, the first molecules 261 may be orderly arranged across a first surface portion 221 of the carrier 220.

The first molecules 261 may comprise a first functional group 271 that is bonded to the first surface portion 221 of the carrier 220. The first functional group 271 may preferentially react with the first surface portion 221 of the carrier 220 and result in the self-assembled arrangement of the first molecules 261. In an embodiment, the first functional group 271 may be bonded or adhered to the first surface portion 221 via chemisorption or physisorption. In an embodiment, the first functional group 271 may comprise siloxanes, siloxane derivatives, silanes, acrylates, or any other functional group that is substantially reactive with the first surface portion 221 of the carrier 220. In an embodiment, the first molecules 261 may be applied to the first surface portion 221 with a spray or dip process.

In an embodiment, the first functional group 271 may be coupled to a second functional group 275 by a backbone that comprises a first moiety 272, a first release moiety 273, and a second moiety 274. That is, the first functional group 271 may be at a first end of the first molecule 261 and the second functional group 275 may be at an opposite second end of the first molecule 261. In an embodiment, the second functional group 275 is substantially non-reactive with the first functional group 271. Additionally, the second functional group 275 may be substantially non-reactive with the first surface portion 221. The non-reactive nature of the second functional group 275 with the first functional group 271 mitigates self-polymerization of the first molecules 261 during deposition of the first monolayer 251 onto the first surface portion 221. The non-reactive nature of the second functional group 275 with the first surface portion 221 improves the self-assembling nature of the first monolayer 251. In an embodiment, the second functional group 275 may comprise any of a variety of acids, acid anhydrides, aliphatic alcohols, aromatic alcohols, or unsaturated hydrocarbons.

In an embodiment, the first moiety 272 and the second moiety 274 may comprise an aliphatic chain of carbon atoms (e.g., wherein the chain is saturated). In some embodiments, the first moiety 272 and the second moiety 274 include a derivative of an ethyl group, a propyl group, a butyl group or the like. Alternatively, first moiety 272 and second moiety 274 may include a long aliphatic chain of carbon atoms, the structure of which is resistive of chain folding.

In an embodiment, the first molecules 261 may comprise a first release moiety 273. The first release moiety 273 may be coupled to the first functional group 271 by the first moiety 272 and to the second functional group 275 by the second moiety 274. However, in other embodiments, one or both of the first moiety 272 and the second moiety 274 may be omitted, and the first release moiety 273 may be directly coupled to one or both of the first functional group 271 and the second functional group 275.

Figure 3A:
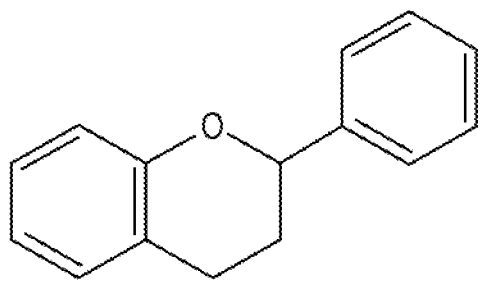
FIGS. 3A-3E are chemical formulas of various release moieties that may be included as the first release moiety or the second release moiety, in accordance with an embodiment.
Figure 3B:
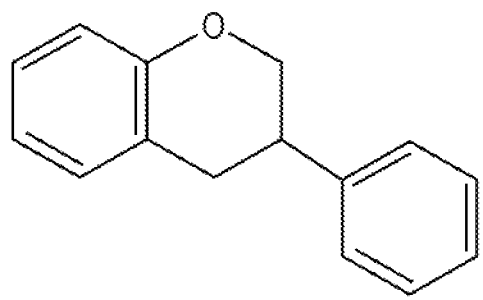
Figure 3C:
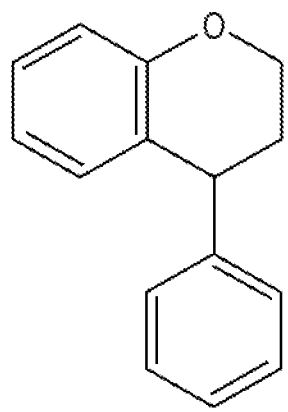
Figure 3D:
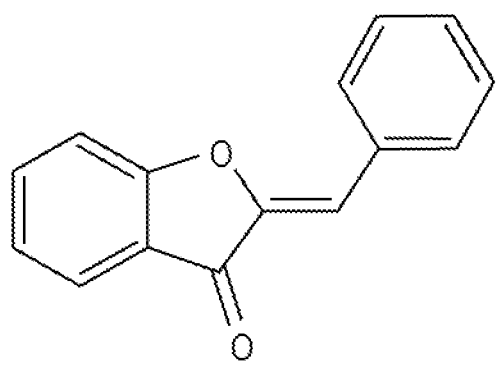
Figure 3E:
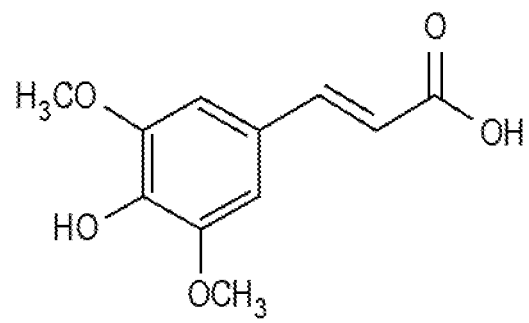

In an embodiment, the first release moiety 273 may comprise a moiety that is adept at absorbing electromagnetic radiation in a given frequency band and, as a result, initiating a chemical reaction that severs the first molecule 261. For example, the given frequency band may be a microwave frequency band, an ultraviolet frequency band (e.g., a near ultraviolet radiation frequency band, a middle ultraviolet radiation frequency band, a far ultraviolet radiation frequency band, an extreme ultraviolet radiation frequency band), or an X-ray frequency band. In an embodiment, the first release moiety may comprise any of a variety of a metallic alkoxide, a metallic oxide nanoparticle, a flavonoid, a flavonoid derivative (e.g., an isoflavonoid, a neoflavonoid, or an aurone), a sinapinic acid, a sinapinic acid derivative, or the like. For example, FIGS. 3A-3E provide exemplary chemical structures of some moieties that may be used as the first release moiety 273 (i.e., FIG. 3A is a flavonoid, FIG. 3B is an isoflavanoid, FIG. 3C is a neoflavanoid, FIG. 3D is an aurone, and FIG. 3E is an sinapinic acid).

Figure 2B:
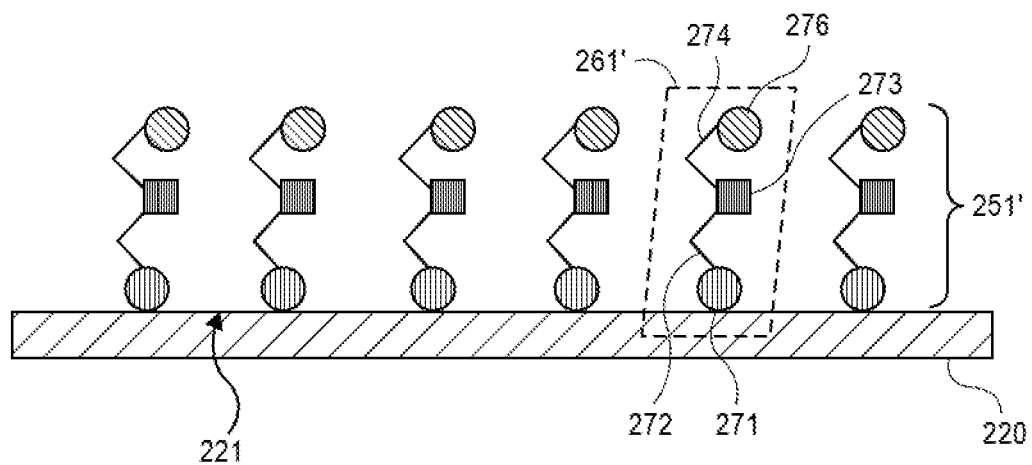
FIG. 2B is a cross-sectional illustration after a functional group of the molecules is modified, in accordance with an embodiment.

Referring now to FIG. 2B, a cross-sectional illustration after the first molecules 261 are reacted to form modified first molecules 261' is shown, in accordance with an embodiment. Modified first molecules 261' may be produced by initiating a reaction of the second functional group 275. That is, the second functional group 275 may be replaced with (or modified to form) a third functional group 276. In an embodiment, the third functional group 276 may include a group resulting from acylation or esterification of an acid anhydride, a thioanhydride, or an amide. In an embodiment, the first monolayer 251 with modified first molecules 261' may be referred to as a modified first monolayer 251'. While the remainder of the process flow depicted in FIGS. 2C-2D follow from the formation of a modified first monolayer 251', it is to be appreciated that in some embodiments the formation of a modified first monolayer 251' may be omitted, and substantially the same processing operations may be implemented using the second functional group 275.

Figure 2C:
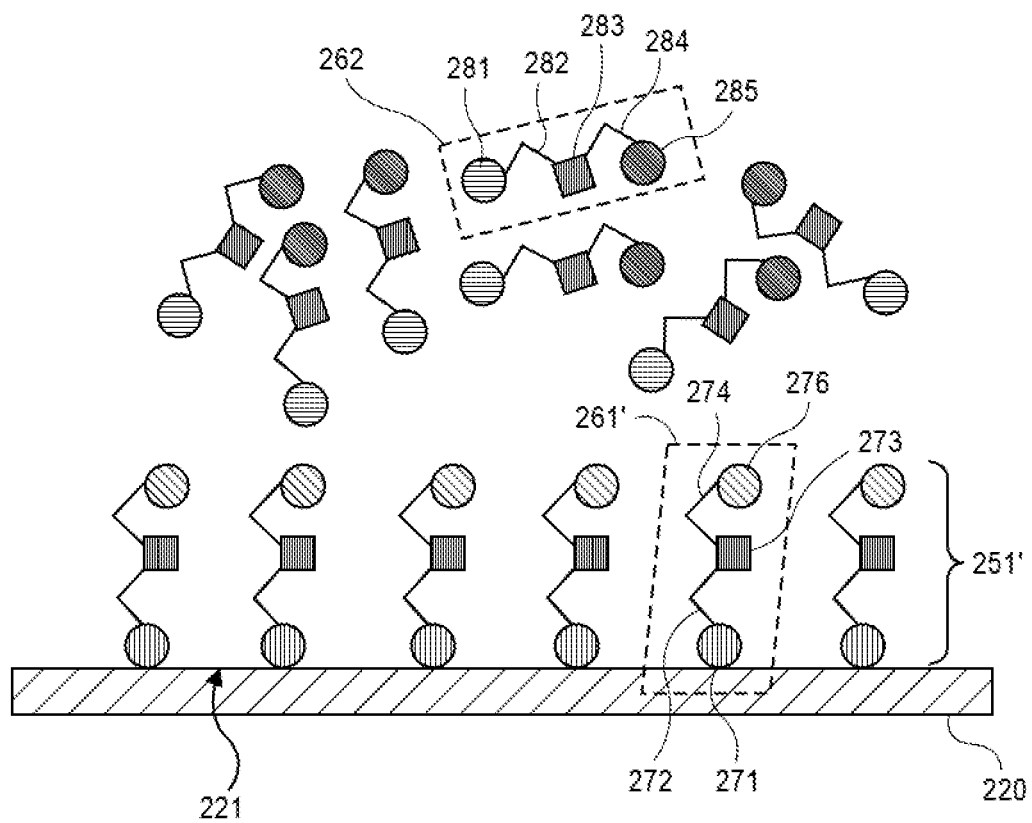
FIG. 2C is a cross-sectional illustration after second molecules with a second release moiety are dispensed over the first monolayer, in accordance with an embodiment.

Referring now to FIG. 2C, a cross-sectional illustration of dispensed second molecules 262 over the modified first monolayer 251' is shown, in accordance with an embodiment. In an embodiment, the second molecules 262 may be dispensed with a spray or dip process. The second molecules 262 may comprise a fourth functional group 281 and a fifth functional group 285. In an embodiment, the fourth functional group 281 may be coupled to the fifth functional group 285 by a backbone that comprises a third moiety 282, a second release moiety 283, and a fourth moiety 284. That is, the fourth functional group 281 may be at a first end of the second molecule 262 and the fifth functional group 285 may be at an opposite second end of the second molecule 262. In an embodiment, the fifth functional group 285 is substantially non-reactive with the fourth functional group 281. The non-reactive nature of the fifth functional group 285 with the fourth functional group 281 mitigates self-polymerization of the second molecules 262 during deposition. In an embodiment, the fourth functional group 281 may be reactive with the third functional group 276 (and/or with the second functional group 275 when present). For example, the fourth functional group 281 may include, or be a derivative of, any of a variety of amines, thiols, disulfides, acid anhydrides, or alcohols. The fifth functional group 285 may include, or be a derivative of, any of a variety of amines, azoles, imides, or cyanoacrylate derivatives—e.g., wherein the fifth functional group 285 enables a strong covalent bond with a dielectric polymer.

In an embodiment, the third moiety 282 and the fourth moiety 284 may comprise an aliphatic chain of carbon atoms (e.g., wherein the chain is saturated). In some embodiments, the third moiety 282 and the fourth moiety 284 include a derivative of an ethyl group, a propyl group, a butyl group or the like. Alternatively, third moiety 282 and fourth moiety 284 may include a long aliphatic chain of carbon atoms, the structure of which is resistive of chain folding.

In an embodiment, the second molecules 262 may comprise a second release moiety 283. The second release moiety 283 may be coupled to the fourth functional group 281 by the third moiety 282 and to the fifth functional group 285 by the fourth moiety 284. However, in other embodiments, one or both of the third moiety 282 and the fourth moiety 284 may be omitted, and the second release moiety 283 may be directly coupled to one or both of the fourth functional group 281 and the fifth functional group 285.

In an embodiment, the second release moiety 283 may comprise a moiety that is adept at absorbing electromagnetic radiation in a given frequency band and, as a result, initiating a chemical reaction that severs the second molecule 262. For example, the given frequency band may be a microwave frequency band, an ultraviolet frequency band (e.g., a near ultraviolet radiation frequency band, a middle ultraviolet radiation frequency band, a far ultraviolet radiation frequency band, an extreme ultraviolet radiation frequency band), or an X-ray frequency band. In an embodiment, the first release moiety may comprise any of a variety of a metallic alkoxide, a metallic oxide nanoparticle, a flavonoid, a flavonoid derivative (e.g., an isoflavonoid, a neoflavonoid, or an aurone), a sinapinic acid, a sinapinic acid derivative, or the like. For example, FIGS. 3A-3E provide exemplary chemical structures of some moieties that may be used as the second release moiety 283.

Figure 2D:
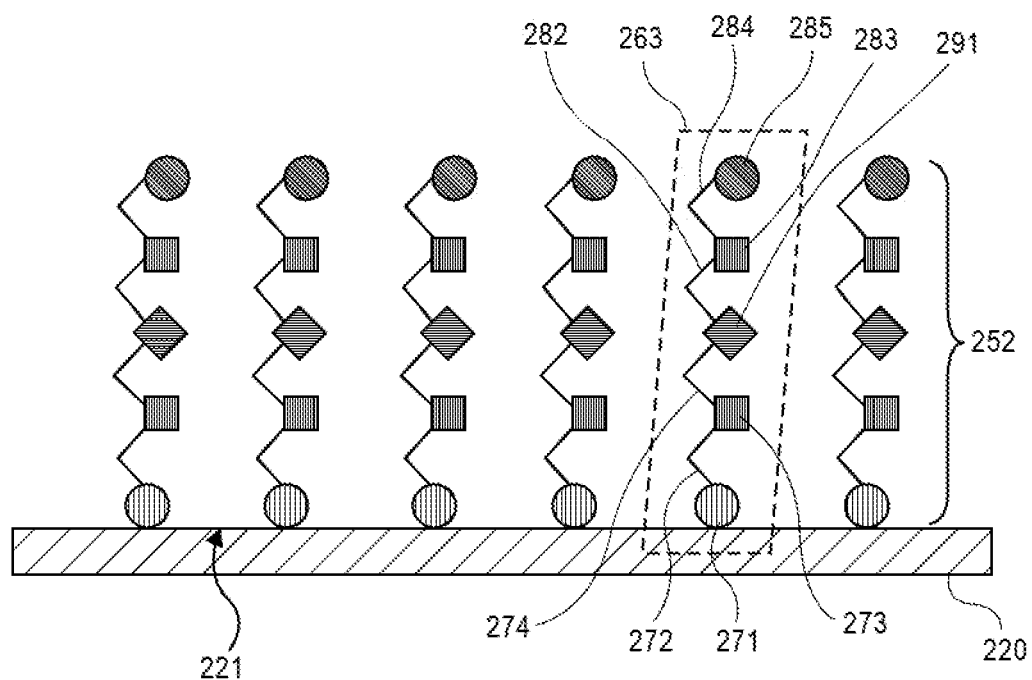
FIG. 2D is a cross-sectional illustration after the second molecules react with the first molecules to form a second monolayer comprising third molecules, in accordance with an embodiment.

Referring now to the FIG. 2D, a cross-sectional illustration after a second monolayer 252 is formed from a plurality of third molecules 263 is shown, in accordance with an embodiment. In an embodiment, the third molecules 263 may be formed by the reaction of the second molecule 262 with the modified first molecule 261' (or with the first molecule 261 when the first molecule 261 is unmodified). Particularly, a reaction to form the second monolayer 252 from the modified first monolayer 251' may include an addition reaction between the modified first molecule 261' and the second molecule 262. In an embodiment, the reaction of the modified first molecule 261' and the second molecule 262 may comprise an addition reaction between the fourth functional group 281 of the second molecule 262 and the third functional group 276 of the modified first molecule 261' that results in the formation of a sixth functional group 291 that links the modified first molecule 261' to the second molecule 262 and forms the third molecule 263.

As shown in FIG. 2D, the second monolayer 252 comprises a plurality of third molecules 263, with each of the third molecules 263 including a first release moiety 273 and a second release moiety 283. The inclusion of two release moieties 273, 283 allows for improved efficiency during the severing of the second monolayer 252. Particularly, the efficiency is improved because there are two locations where each of the third molecules 263 may be severed, thereby increasing the probability of severing the third molecule 263 during exposure. In an embodiment, the first release moiety 273 may be the same moiety as the second release moiety 283. In other embodiments, the first release moiety 273 may be a different moiety than the second release moiety 283.

Figure 2E:
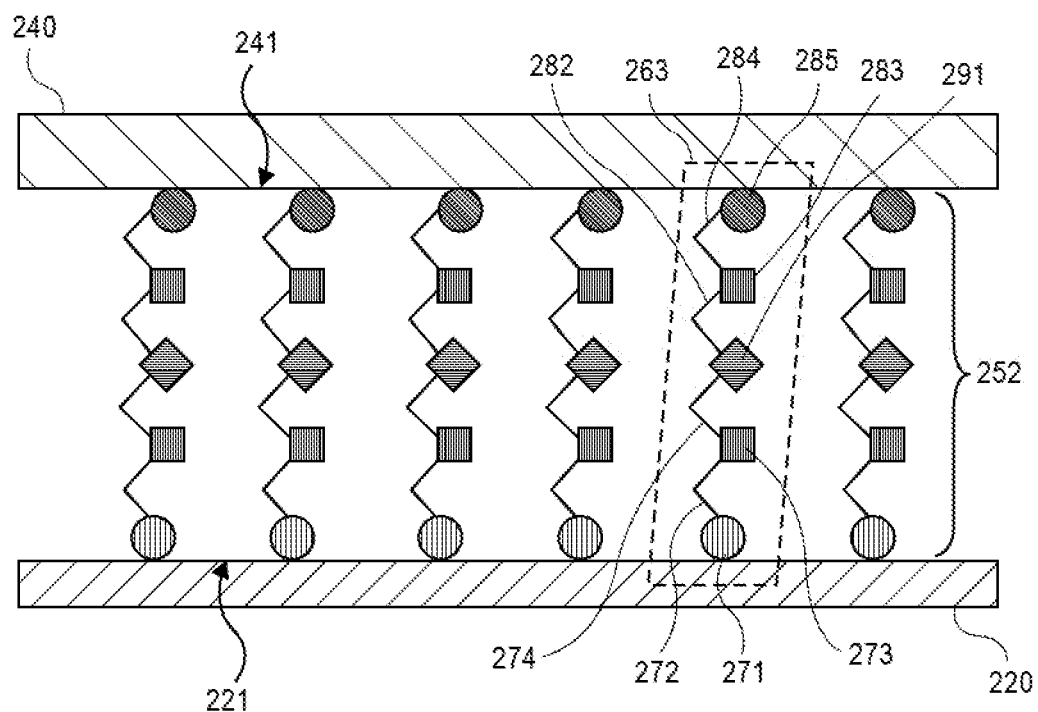
FIG. 2E is a cross-sectional illustration after a dielectric layer is adhered to the second monolayer, in accordance with an embodiment.

Referring now to FIG. 2E, a cross-sectional illustration after a dielectric layer 240 is applied to the second monolayer 252 is shown, in accordance with an embodiment. In an embodiment, the second monolayer 252 may be bonded to a second surface portion 241 of the dielectric layer 240. The bond to the second surface portion 241 may be made by the fifth functional group 285.

Figure 4A:
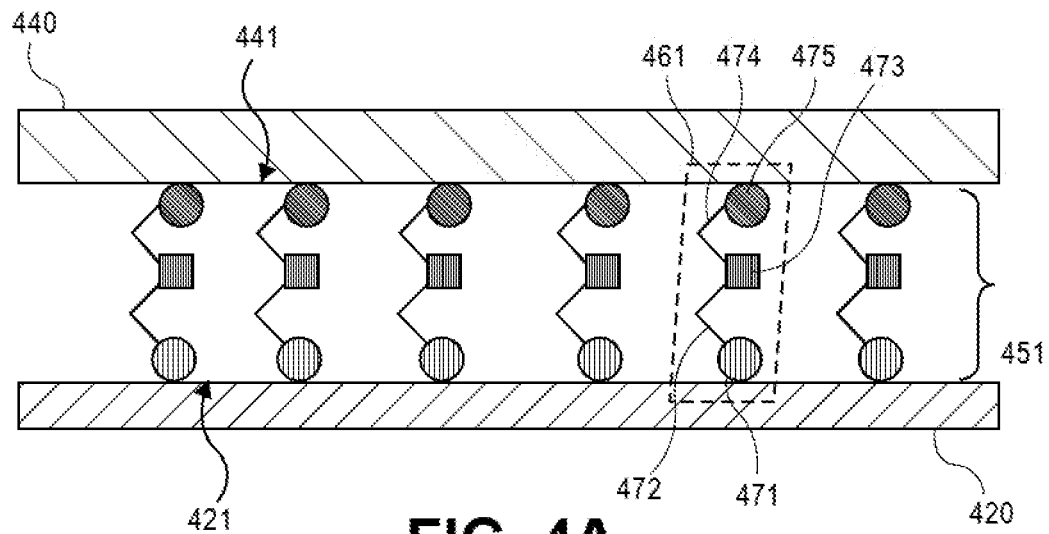
FIG. 4A is a cross-sectional illustration of a dielectric layer attached to a carrier by a monolayer with a single release moiety in each molecule, in accordance with an embodiment.
Figure 4B:
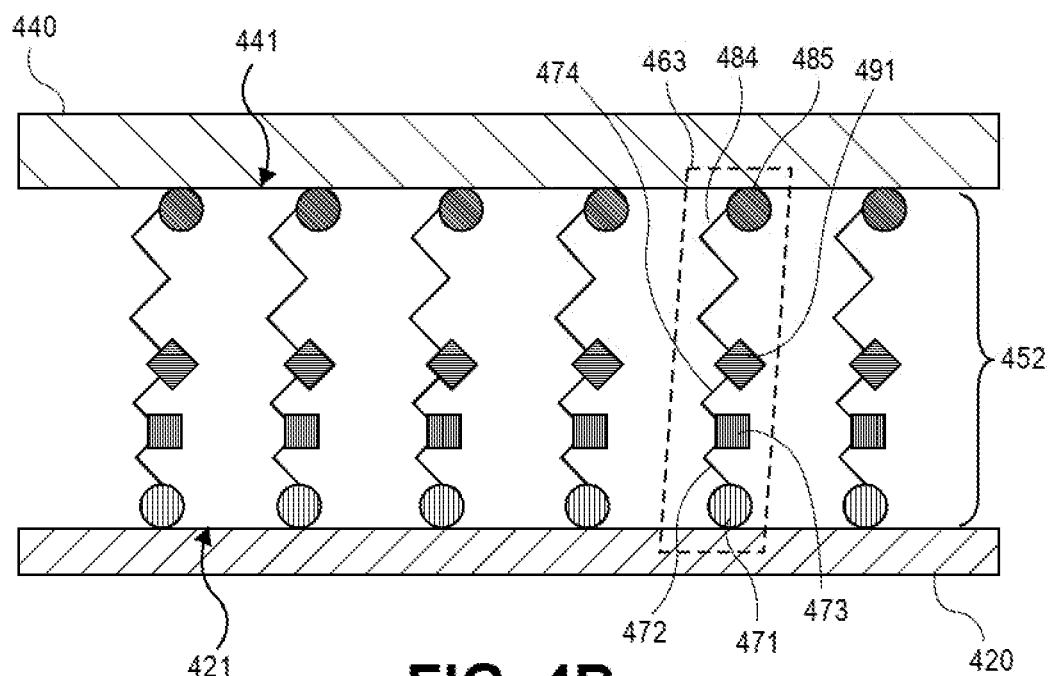
FIG. 4B is a cross-sectional illustration of a dielectric layer attached to a carrier by a monolayer with a single release moiety in each molecule, in accordance with an additional embodiment.
Figure 4C:
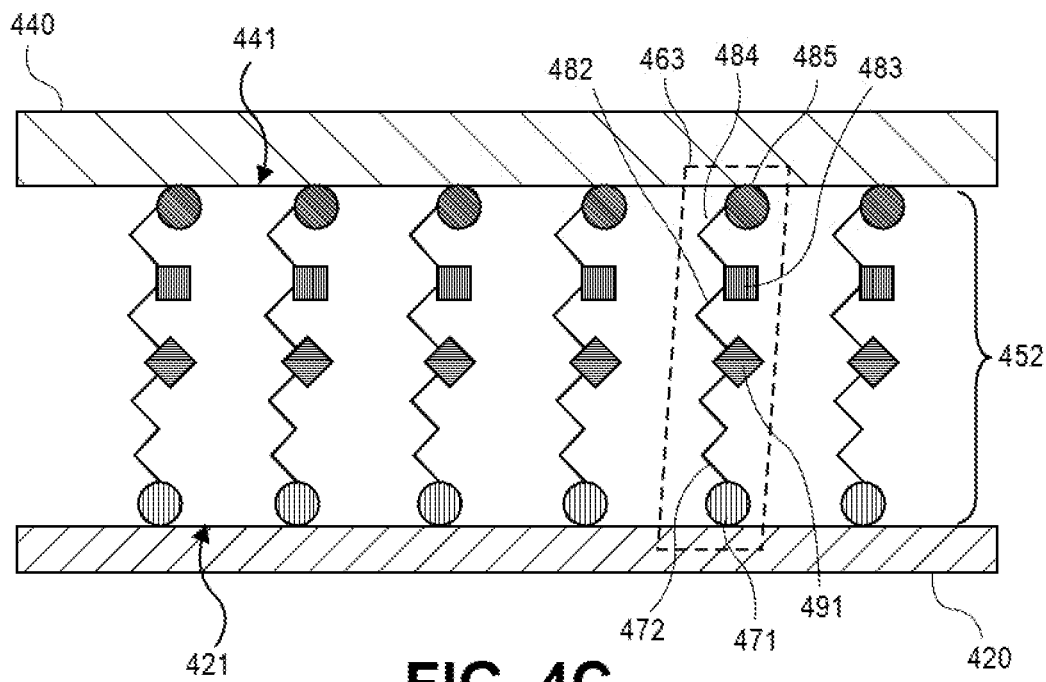
FIG. 4C is a cross-sectional illustration of a dielectric layer attached to a carrier by a monolayer with a single release moiety in each molecule, in accordance with an additional embodiment.

Referring now to FIGS. 4A-4C, several cross-sectional illustrations of monolayers for attaching a dielectric layer to a carrier are shown, in accordance with additional embodiments.

Referring now to FIG. 4A, a cross-sectional illustration of a first monolayer 451 that attaches a first surface portion 421 of a carrier 420 to a second surface portion 441 of a dielectric layer 440 is shown, in accordance with an embodiment. In an embodiment, the first monolayer 451 may comprise first molecules 461. The first molecules 461 may comprise a first functional group 471 and a second functional group 475. The first functional group 471 may be bonded to the first surface portion 421 and the second functional group 475 may be bonded to the second surface portion 441. In an embodiment, a first release moiety 473 may be coupled between the first functional group 471 and the second function group 475 by first moiety 472 and second moiety 474.

Referring now to FIG. 4B, a cross-sectional illustration of a second monolayer 452 that attaches a first surface portion 421 of a carrier 420 to a second surface portion 441 of a dielectric layer 440 is shown, in accordance with an embodiment. In an embodiment, the second monolayer 452 may comprise third molecules 463. The third molecules 463 may be substantially similar to the third molecules 263 described in FIG. 2E, with the exception that only a first release moiety 473 is provided. In such an embodiment, the first release moiety 473 may be part of a first molecule that has been reacted with a second molecule that does not include a release moiety. The first molecule and the second molecule may react to form a sixth functional group 491. The first release moiety 473 may be between the first functional group 471 and the sixth functional group 491. That is, the first release moiety 473 may be coupled to the first functional group 471 by a moiety 472 and coupled to the sixth functional group 491 by a moiety 474. The sixth functional group 491 may be coupled to a fifth functional group 485 by a moiety 484. The fifth functional group 485 may be bonded to the second surface portion 441.

Referring now to FIG. 4C, a cross-sectional illustration of a second monolayer 452 that attaches a first surface portion 421 of a carrier 420 to a second surface portion 441 of a dielectric layer 440 is shown, in accordance with an additional embodiment. The second monolayer 452 may be substantially similar to the second monolayer 452 in FIG. 4B, with the exception of the position of the release moiety. Particularly, in the third molecules 463, a second release moiety 483 may be located between the sixth functional group 491 and the fifth functional group 485. That is, the second release moiety 483 may be coupled to the sixth functional group 491 by a moiety 482 and coupled to the fifth functional group 485 by a moiety 484. Such an embodiment is provided when a first molecule does not include a release moiety and the second molecule (which reacts with the first molecule to form the third molecule) includes the second release moiety 483.

In the embodiments disclosed in FIGS. 4B and 4C, only a single release moiety (i.e., first release moiety 473 in FIG. 4B and second release moiety 483 in FIG. 4C) is located in each of the third molecules 463. However, such embodiments still allow for severing of the monolayers 452. Furthermore, since release moieties such as those described herein are relatively expensive moieties to include in a molecule, the cost to fabricate the monolayer 452 is reduced. While efficiency of severing the monolayer 452 may be reduced compared to the monolayer 252 in FIG. 2E (which includes a first release moiety 273 and a second release moiety 283), the severing of the monolayer 452 may still be implemented (e.g., by increasing the power of the electromagnetic radiation or otherwise increasing the dose applied to the monolayer 452).

Figure 5A:
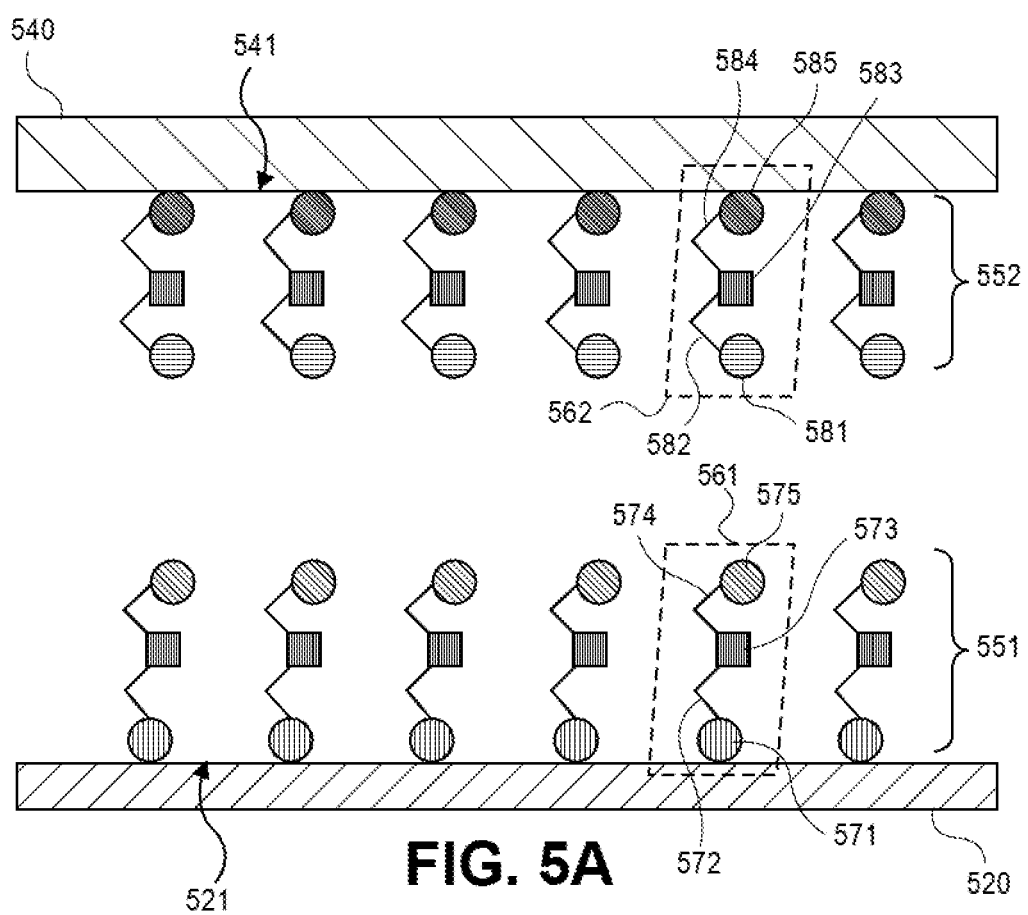
FIG. 5A is a cross-sectional illustration of a first monolayer with first molecules attached to a carrier and a second monolayer with second molecules attached to a dielectric layer, in accordance with an embodiment.
Figure 5B:
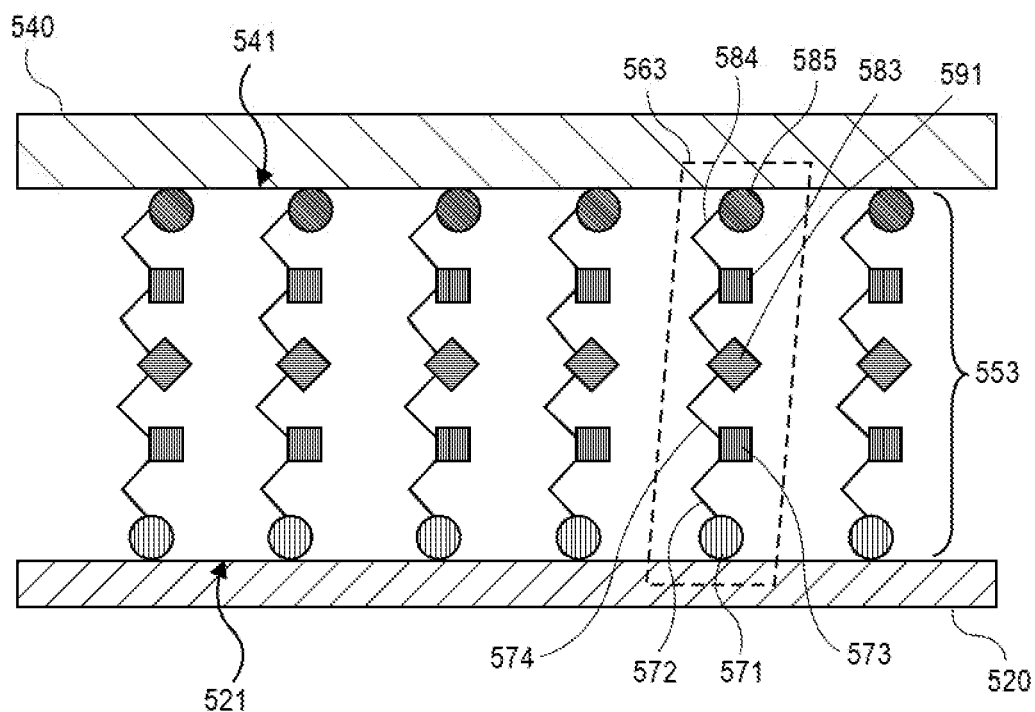
FIG. 5B is a cross-sectional illustration after the first monolayer and the second monolayer react to form a third monolayer that couples the carrier to the dielectric layer, in accordance with an embodiment.

Referring now to FIGS. 5A and 5B, an alternative process for forming a monolayer with release moieties is shown, in accordance with an additional embodiment. Particularly, FIGS. 5A and 5B illustrate a process where a first monolayer 551 is bonded to a first surface portion 521 of the carrier 520 and a second monolayer 552 is bonded to a second surface portion 541 of the dielectric layer 540. The two monolayers 551, 552 are then reacted with each other to form a third monolayer 553 that bonds the first surface portion 521 to the second surface portion 541.

Referring now to FIG. 5A, a cross-sectional illustration of a carrier 520 and a dielectric layer 540 are shown. In an embodiment, a first monolayer 551 may be bonded to a first surface portion 521 of the carrier 520. The first monolayer 551 may comprise first molecules 561. The first molecules 561 may comprise a first functional group 571, a first moiety 572, a release moiety 573, a second moiety 574, and a second functional group 575. The first functional group 571 may be bonded or otherwise attached to the first surface portion 521.

In an embodiment, a second monolayer 552 may be bonded to a second surface portion 541 of the dielectric layer 540. The second monolayer 552 may comprise second molecules 562. The second molecules 562 may comprise a third functional group 581, a third moiety 582, a second release moiety 583, a fourth moiety 584, and a fourth functional group 585. The fourth functional group 585 may be bonded or otherwise attached to the second surface portion 541.

Referring now to FIG. 5B, a cross-sectional illustration after the first monolayer 551 and the second monolayer 552 are reacted with each other to form a third monolayer 553 is shown, in accordance with an embodiment. In an embodiment, the second functional group 575 and the third functional group 581 may react to form a fifth functional group 591 that connects the first molecule 561 to the second molecule 562 to form a third molecule 563. In some embodiments, an intermediate step of reacting the second functional group 575 to form a modified second functional group may be implemented before forming the third molecule 563 (e.g., similar to the process described with respect to FIG. 2B).

In the embodiment illustrated in FIG. 5B, each third molecule 563 comprises a first release moiety 573 and a second release moiety 583. However, embodiments are not limited to such configurations. For example, one of the first molecules 561 or the second molecules 562 may optionally omit a release moiety and result in a structure similar to those illustrated in FIG. 4B or FIG. 4C.

Referring now to FIGS. 6A-6D, electronic packages 600 after release from the carrier are shown, in accordance with various embodiments. Particularly, embodiments disclosed in FIGS. 6A-6D depict the presence of a residual monolayer 630 that may be present on a surface portion 641 of the package substrate 640. It is to be appreciated that the residual monolayer 630 in FIGS. 6A-6D is not shown to scale in order to clearly illustrate the molecules of the residual monolayer 630. However, it is to be appreciated that the residual monolayer 630 is still identifiable on the surface portion using various analysis tools. For example, ultramicrotomy techniques may be used to prepare thin cross-sectional samples for TEM analysis to directly observe any residual monolayers 630 (e.g., including the presence of release moieties) on the surface. Other methods, such as electron energy loss spectroscopy (EELS) may be used to detect the distinctive signature of low atomic weight elements in the molecules of the residual monolayer 630. Additionally, spectroscopic techniques such as infrared attenuated total reflection (ATR-IR), atomic force microscopy (AFM) assisted nano-IR, or Raman spectroscopy may be used to determine the presence of a residual monolayer 630.

Figure 6A:
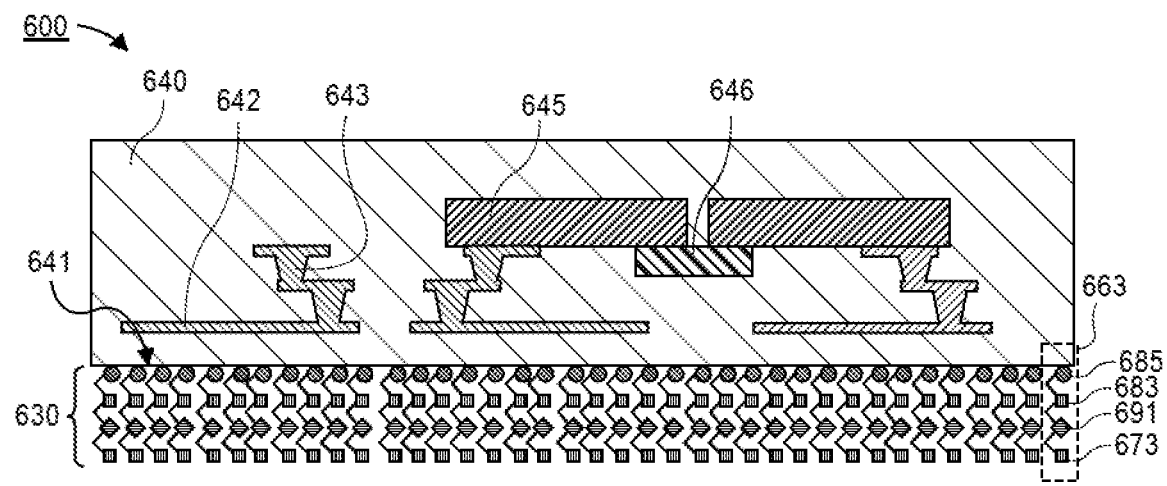
FIG. 6A is a cross-sectional illustration of an electronic package with a residual monolayer comprising molecules with first and second release moieties, in accordance with an embodiment.

Referring now to FIG. 6A, a cross-sectional illustration of an electronic package 600 with a residual monolayer 630 is shown, in accordance with an embodiment. In an embodiment, the electronic package 600 may comprise a package substrate 640. The electronic package 600 may comprise conductive traces 642 and vias 643. One or more dies 645 may be embedded in the package substrate 640. In some embodiments, a bridge 646 (e.g., an EMIB) may couple dies 645 together. As shown in FIG. 6A, the bridge 646 may be below the dies 645, as is typical in EMIB architectures. However, other embodiments may include a bridge 646 that is above the dies 645.

In an embodiment, the residual monolayer 630 may comprise a plurality of molecules 663 attached to the surface portion 641 of the package substrate 640. In an embodiment, the molecules may comprise a first release moiety 673, a first functional group 691, a second release moiety 683, and a second functional group 685 that is bonded to the surface portion 641. The functional groups 691, 685 and the release moieties 673, 683 may be coupled together by carbon chains or any other suitable moiety.

In the illustrated embodiment, the residual monolayer 630 terminates uniformly at the first release moiety 673. Particularly, this is the result of the first release moiety 673 absorbing sufficient electromagnetic radiation to sever the monolayer (e.g., a second monolayer 252, such as shown in FIG. 2E) before the second release moieties 683 cause a severing of the monolayer. However, embodiments are not limited to such configurations. For example, FIG. 6B illustrates a residual monolayer 630 that includes a severing at both the first and second release moieties 673, 683.

Figure 6B:
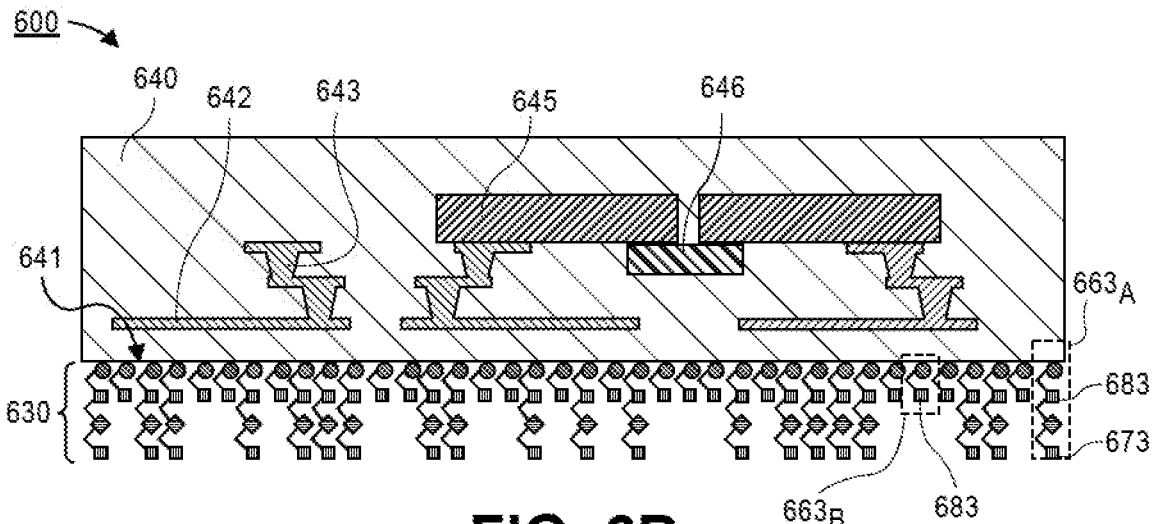
FIG. 6B is a cross-sectional illustration of an electronic package with a residual monolayer comprising first molecules and second molecules, where the first molecules have first and second release moieties and the second molecules have first release moieties, in accordance with an embodiment.

Referring now to FIG. 6B, a cross-sectional illustration of an electronic package 600 with a residual monolayer 630 is shown, in accordance with an embodiment. In an embodiment, the residual monolayer 630 may comprise first molecules $663_A$ and second molecules $663_B$. The first molecules $663_A$ may comprise a first release moiety 673 and a second release moiety 683, and the second molecules $663_B$ may comprise a second release moiety 683. Particularly, FIG. 6B illustrates that the severance of the monolayer may occur at different locations (i.e., at the first release moiety 673 or the second release moiety 683).

Figure 6C:
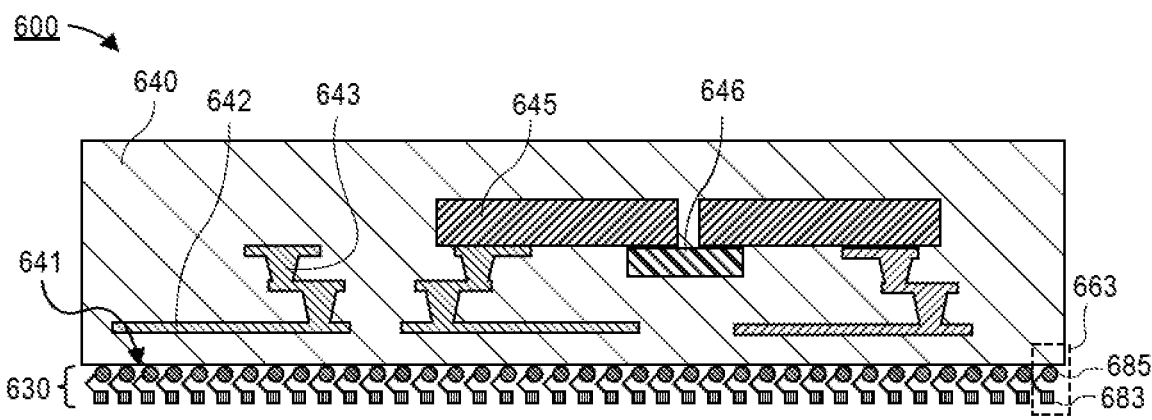
FIG. 6C is a cross-sectional illustration of an electronic package with a residual monolayer comprising first molecules with a first release moiety, in accordance with an embodiment.

Referring now to FIG. 6C, a cross-sectional illustration of an electronic package 600 with a residual monolayer 630 is shown, in accordance with an embodiment. In an embodiment, the residual monolayer 630 may comprise molecules 663. The molecules 663 may comprise a release moiety 683 and a functional group 685 attached to the surface portion 641 of the package substrate 640. Such an embodiment may be obtained when only a single release moiety is included in the molecules of the monolayer prior to severing (e.g., similar to the embodiments illustrated in FIGS. 4A and 4C).

Figure 6D:
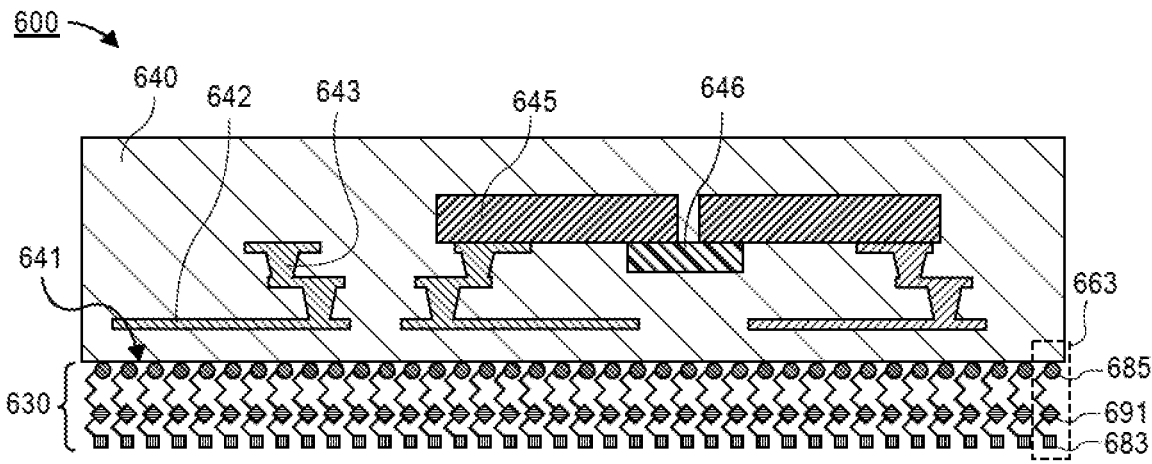
FIG. 6D is a cross-sectional illustration of an electronic package with a residual monolayer comprising first molecules with a first release moiety and two functional groups, in accordance with an embodiment.

Referring now to FIG. 6D, a cross-sectional illustration of an electronic package 600 with a residual monolayer 630 is shown, in accordance with an embodiment. In an embodiment, the residual monolayer 630 may comprise molecules 663. The molecules 663 may comprise a release moiety 683 at one end and a functional group 685 attached to the surface portion 641 of the package substrate 640. The molecules 663 may further comprise functional group 691 between the release moiety 683 and the functional group 685. Such an embodiment may be obtained when only a single release moiety is included in the molecules of the monolayer prior to severing (e.g., similar to the embodiment illustrated in FIG. 4B).

Figure 7:
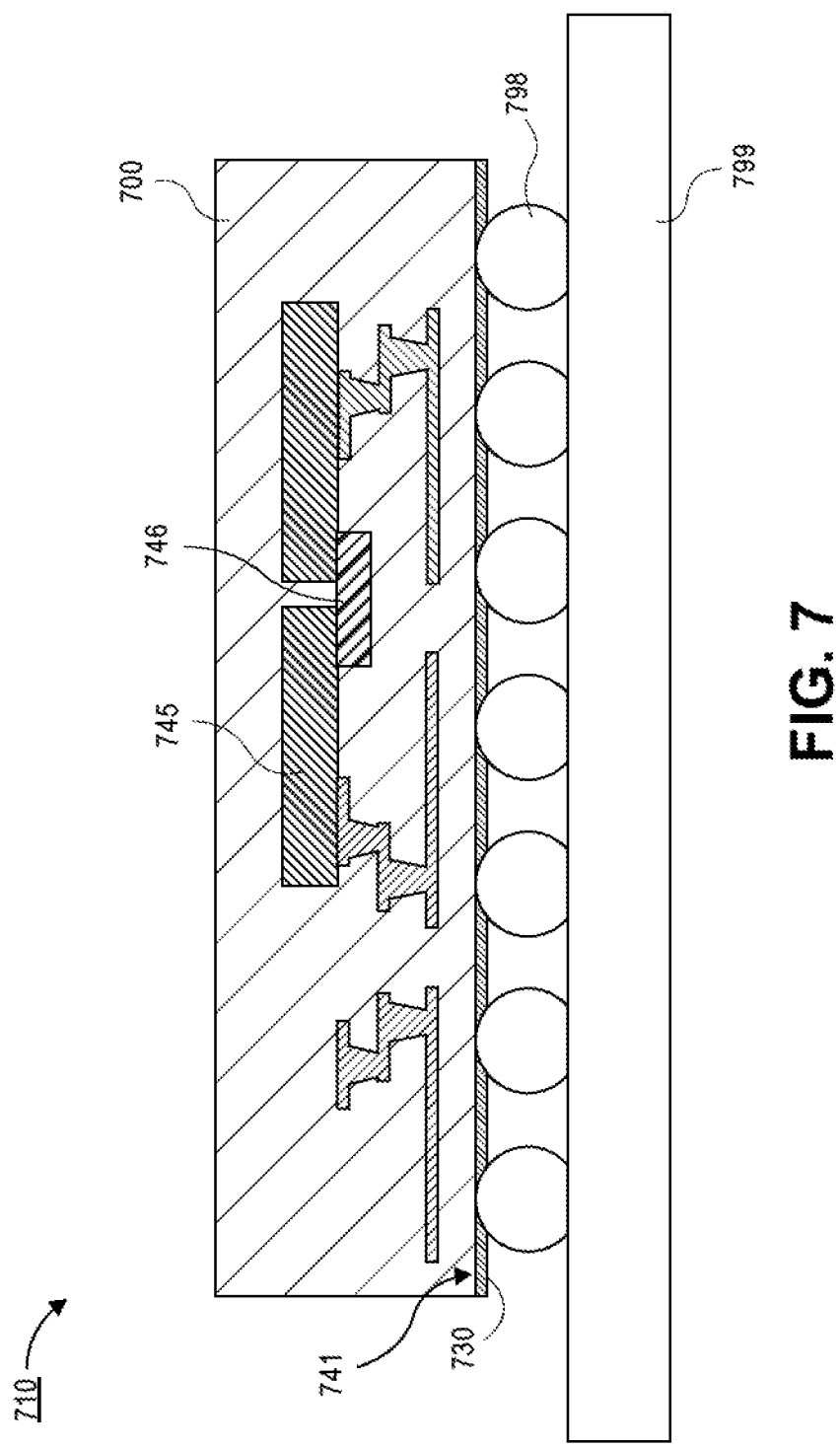
FIG. 7 is a cross-sectional illustration of an electronic system that comprises an electronic package with a monolayer disposed over a surface, in accordance with an embodiment.

Referring now to FIG. 7, a cross-sectional illustration of an electronic system 710 is shown, in accordance with an embodiment. In an embodiment, the electronic system 710 may comprise a package substrate 700 that is attached to a board 799. For example, the package substrate 700 may be attached to the board 799 (e.g., a motherboard or the like) with interconnects 798 (e.g., solder bumps, wire bonds, sockets, or the like).

In an embodiment, a dies 745, bridges 746, or the like may be embedded in the package substrate 700. In a particular embodiment, the package substrate 700 may comprise a HDP architecture or an EMIB architecture. The package substrate 700 may use a combination of decreasing FLS and multi-chip assemblies unified on a package. Embedded dies within the substrate package and/or assembled dies on the substrate package enable the creation of multi-chip electronic packages delivering SOC type architecture to multi-process node chiplet architectures.

In an embodiment, a surface portion 741 of the package substrate 700 may comprise a residual monolayer 730, such as those described in greater detail above. For example, the residual monolayer 730 may comprise molecules with one or more release moieties. In an embodiment, the board 799 may also comprise a surface portion with a residual monolayer (not shown) comprising molecules with one or more release moieties.

While FIG. 7 illustrates an EMIB architecture, it is to be appreciated that embodiments are not limited to such configurations. For example, an electronic system 710 may also include die first architectures and still include a residual monolayer 730, such as those described in greater detail above.

Figure 8:
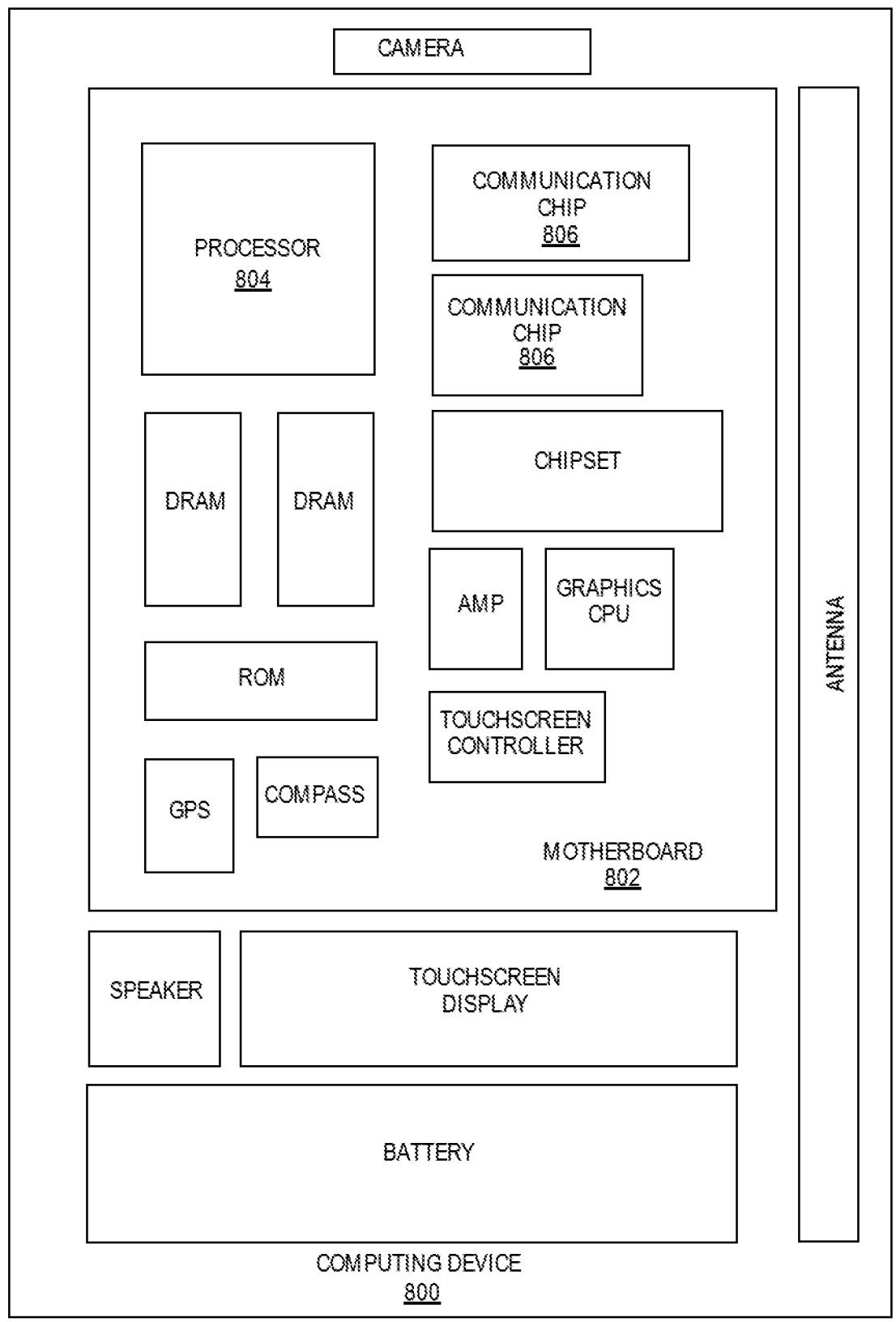
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged in an electronic system that comprises a package substrate with a residual monolayer over a surface portion, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged in an electronic system that comprises a package substrate with a residual monolayer over a surface portion, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate having a first surface and a second surface opposite from the first surface; a monolayer having a plurality of first molecules over the first surface of the package substrate, wherein the first molecules each comprise: a first functional group attached to the first surface; and a first release moiety attached to the first functional group.

Example 2: the electronic package of Example 1, wherein the first release moiety absorbs microwave radiation.

Example 3: the electronic package of Example 2, wherein the first release moiety is a metallic alkoxide.

Example 4: the electronic package of Example 2, wherein the first release moiety is a metallic oxide nanoparticle.

Example 5: the electronic package of Example 1, wherein the first release moiety absorbs near ultraviolet radiation, middle ultraviolet radiation, far ultraviolet radiation, extreme ultraviolet radiation, or X-rays.

Example 6: the electronic package of Example 5, wherein the first release moiety comprises a flavonoid, a flavonoid derivative, a sinapinic acid, or a sinapinic acid derivative.

Example 7: the electronic package of Example 6, wherein the first release moiety is an isoflavanoid, a neoflavanoid, or an aurone.

Example 8: the electronic package of Examples 1-7, wherein one or more of the first molecules further comprises: a second functional group, wherein the first release moiety is between the first functional group and the second functional group; and a second release moiety coupled to the second functional group.

Example 9: the electronic package of Example 8, wherein the first release moiety is the same as the second release moiety.

Example 10: the electronic package of Example 8, wherein the first release moiety is different than the second release moiety.

Example 11: the electronic package of Examples 1-10, further comprising: a die embedded in the package substrate.

Example 12: the electronic package of Example 11, further comprising: an embedded multi-die interconnect bridge (EMIB) coupled to the die.

Example 13: an electronic package, comprising: a package substrate having a first surface and a second surface opposite from the first surface; a monolayer having a plurality of molecules over the first surface of the package substrate, wherein the molecules each comprise: a functional group attached to the first surface of the package substrate; and a release moiety attached to the functional group.

Example 14: the electronic package of Example 13, wherein the release moiety is attached to the first surface.

Example 15: the electronic package of Example 13 or Example 14, wherein the functional group is attached to the first surface.

Example 16: a method of fabricating an electronic package, comprising: forming a first monolayer comprising a plurality of first molecules over a surface of a carrier, wherein the first molecules comprise: a first functional group attached to the carrier; a first release moiety coupled to the first functional group; and a second functional group coupled to the first release moiety, wherein the first functional group is substantially non-reactive with the second functional group; performing reactions to produce a second monolayer from both the first monolayer and second molecules, wherein the second molecules comprise: a third functional group; a second release moiety; and a fourth functional group; and coupling a dielectric layer surface to the surface of the carrier via the second monolayer.

Example 17: the method of Example 16, further comprising: forming an electronic package over the dielectric layer; and exposing the first release moiety and the second release moiety to electromagnetic radiation of a frequency band absorbable by the first release moiety and the second release moiety to initiate a severing of the second monolayer at the first release moiety and/or the second release moiety.

Example 18: the method of Example 17, wherein the frequency band is a microwave frequency band.

Example 19: the method of Example 17, wherein the frequency band is a near ultraviolet radiation frequency band, a middle ultraviolet radiation frequency band, a far ultraviolet radiation frequency band, an extreme ultraviolet radiation frequency band, or an X-ray frequency band.

Example 20: the method of Examples 16-19, wherein performing reactions to produce the second monolayer comprises performing one of an acylation of the second functional group or an esterification of the second functional group.

Example 21: the method of Examples 16-20, wherein coupling the dielectric layer surface to the surface of the carrier comprises attaching the second molecules to the dielectric layer surface after performing the reactions to produce the second monolayer.

Example 22: the method of Examples 16-19 and 21, wherein performing reactions to produce the second monolayer comprises, forming a third monolayer, including attaching the second molecules to the dielectric layer surface, and wherein coupling the surface of the carrier to the dielectric layer surface comprises: after forming the first monolayer and after forming the third monolayer, performing a reaction with the first monolayer and the third monolayer.

Example 23: the method of Examples 16-22, wherein the first release moiety or the second release moiety comprise a metallic alkoxide, a metallic oxide nanoparticle, a flavonoid, a flavonoid derivative, a sinapinic acid, or a sinapinic acid derivative.

Example 24: an electronic system, comprising: a board; a package substrate coupled to the board, wherein the package substrate comprises a first surface and a second surface; a plurality of dies embedded in the package substrate; and a monolayer comprising a plurality of first molecules on the first surface of the package substrate, wherein the first molecules comprise a release moiety.

Example 25: the electronic system of Example 24, further comprising an embedded multi-die interconnect bridge (EMIB) coupling dies together.

What is claimed is:

1. An electronic package, comprising:
a package substrate having a first surface and a second surface opposite from the first surface; and
a monolayer having a plurality of first molecules over the first surface of the package substrate, wherein the first molecules each comprise:

a first functional group attached to the first surface; and a first release moiety attached to the first functional group, wherein the first release moiety is separable from the first functional group.

2. The electronic package of claim 1, wherein the first release moiety absorbs microwave radiation.

3. The electronic package of claim 2, wherein the first release moiety is a metallic alkoxide.

4. The electronic package of claim 2, wherein the first release moiety is a metallic oxide nanoparticle.

5. The electronic package of claim 1, wherein the first release moiety absorbs near ultraviolet radiation, middle ultraviolet radiation, far ultraviolet radiation, extreme ultraviolet radiation, or X-rays.

6. The electronic package of claim 5, wherein the first release moiety comprises a flavonoid, a flavonoid derivative, a sinapinic acid, or a sinapinic acid derivative.

7. The electronic package of claim 6, wherein the first release moiety is an isoflavanoid, a neoflavanoid, or an aurone.

8. The electronic package of claim 1, wherein one or more of the first molecules further comprises:

a second functional group, wherein the first release moiety is between the first functional group and the second functional group; and a second release moiety coupled to the second functional group.

9. The electronic package of claim 8, wherein the first release moiety is the same as the second release moiety.

10. The electronic package of claim 8, wherein the first release moiety is different than the second release moiety.

11. The electronic package of claim 1, further comprising:

a die embedded in the package substrate.

12. The electronic package of claim 11, further comprising:

an embedded multi-die interconnect bridge (EMIB) coupled to the die.

13. An electronic package, comprising:

a package substrate having a first surface and a second surface opposite from the first surface;

a monolayer having a plurality of first molecules over the first surface of the package substrate, wherein the first molecules each comprise:

a first functional group attached to the first surface; and a first release moiety attached to the first functional group, wherein the first release moiety absorbs microwave radiation.

14. The electronic package of claim 13, wherein the first release moiety is a metallic alkoxide.

15. The electronic package of claim 13, wherein the first release moiety is a metallic oxide nanoparticle.

16. An electronic package, comprising:

a package substrate having a first surface and a second surface opposite from the first surface;

a monolayer having a plurality of first molecules over the first surface of the package substrate, wherein the first molecules each comprise:

a first functional group attached to the first surface; and a first release moiety attached to the first functional group, wherein one or more of the first molecules further comprises:

a second functional group, wherein the first release moiety is between the first functional group and the second functional group; and a second release moiety coupled to the second functional group.

17. The electronic package of claim 16, wherein the first release moiety is the same as the second release moiety.

18. The electronic package of claim 16, wherein the first release moiety is different than the second release moiety.

* * * * *